United States Patent
Matsuyama et al.

(10) Patent No.: US 9,466,942 B2
(45) Date of Patent: Oct. 11, 2016

(54) OPTICAL ELEMENT MODULE

(71) Applicant: FURUKAWA ELECTRIC CO., LTD., Tokyo (JP)

(72) Inventors: Tetsuya Matsuyama, Tokyo (JP); Maiko Ariga, Tokyo (JP); Toshio Sugaya, Tokyo (JP); Toshio Kimura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/564,270

(22) Filed: Dec. 9, 2014

(65) Prior Publication Data

US 2015/0098480 A1 Apr. 9, 2015

Related U.S. Application Data

(63) Continuation of application No. PCT/JP2013/066857, filed on Jun. 19, 2013.

(30) Foreign Application Priority Data

Jun. 22, 2012 (JP) .................................. 2012-141302

(51) Int. Cl.
*H01S 3/04* (2006.01)
*H01S 5/024* (2006.01)
(Continued)

(52) U.S. Cl.
CPC ....... *H01S 5/02415* (2013.01); *H01S 5/02208* (2013.01); *H01S 5/02248* (2013.01); *H01S 5/02438* (2013.01); *H01S 5/02446* (2013.01);
(Continued)

(58) Field of Classification Search
CPC ........ H01S 5/00; H01S 5/024; H01S 5/02407
USPC .......................... 372/34, 36, 43.01, 50.23, 65
See application file for complete search history.

(56) References Cited

U.S. PATENT DOCUMENTS 6,116,792 A * 9/2000 Kosugi ............................ 385/92
6,931,215 B1 * 8/2005 Fukuda et al. ................. 398/201
(Continued)

FOREIGN PATENT DOCUMENTS

JP 2002-131585 A 5/2002
JP 2004-095920 A 3/2004
(Continued)

OTHER PUBLICATIONS

International Search Report Issued on Jul. 30, 2013 for PCT/JP2013/066857 Filed on Jun. 19, 2013 (English Language).
(Continued)

*Primary Examiner* — Dung Nguyen
(74) *Attorney, Agent, or Firm* — Oblon, McClelland, Maier & Neustadt, L.L.P.

(57) ABSTRACT

An optical element module includes a casing having a bottom plate, a temperature-adjusting unit being mounted on the bottom plate in the casing and having at least a lower layer portion and an upper layer portion positioned above the lower layer portion, a support member mounted on the temperature-adjusting unit in the casing, and a semiconductor laser element being mounted on the support member and outputting a laser light to a forward side. The upper layer portion of the temperature-adjusting unit projects at a backward side of the semiconductor laser element relative to the lower layer portion.

8 Claims, 5 Drawing Sheets

(51) Int. Cl.
*H01S 5/12* (2006.01)
*H01S 5/022* (2006.01)
*H01S 5/0683* (2006.01)
*H01S 5/0687* (2006.01)
*H01S 5/00* (2006.01)
*H01S 5/026* (2006.01)

(52) U.S. Cl.
CPC ........... *H01S 5/0683* (2013.01); *H01S 5/0687* (2013.01); *H01S 5/12* (2013.01); *H01S 5/0064* (2013.01); *H01S 5/026* (2013.01); *H01S 5/0222* (2013.01); *H01S 5/0265* (2013.01); *H01S 5/02268* (2013.01); *H01S 5/02284* (2013.01)

(56) References Cited

U.S. PATENT DOCUMENTS

| | | | | |
|---|---|---|---|---|
| 6,975,780 | B2* | 12/2005 | Stegmuller | H04B 10/25752 359/245 |
| 2002/0018500 | A1* | 2/2002 | Aikiyo et al. | 372/36 |
| 2002/0048297 | A1 | 4/2002 | Irie et al. | |
| 2008/0187268 | A1 | 8/2008 | Kaneko et al. | |
| 2010/0177793 | A1* | 7/2010 | Rossi | H01S 5/141 372/20 |
| 2012/0020379 | A1 | 1/2012 | Muranushi et al. | |
| 2012/0128375 | A1 | 5/2012 | Kimoto et al. | |

FOREIGN PATENT DOCUMENTS

| | | |
|---|---|---|
| JP | 2008-193003 A | 8/2008 |
| JP | 2009-267386 A | 11/2009 |
| JP | 2010-258354 A | 11/2010 |
| JP | 2011-035060 A | 2/2011 |

OTHER PUBLICATIONS

International Written Opinion Issued on Jul. 30, 2013 for PCT/JP2013/066857 Filed on Jun. 19, 2013.

* cited by examiner

OPTICAL ELEMENT MODULE

CROSS-REFERENCE TO RELATED APPLICATION

This application is a continuation of PCT International Application No. PCT/JP2013/066857 filed on Jun. 19, 2013 which claims the benefit of priority from Japanese Patent Application No. 2012-141302 filed on Jun. 22, 2012, the entire contents of which are incorporated herein by reference.

BACKGROUND OF THE INVENTION

1. Field of the Invention

The present invention relates to an optical element module containing a semiconductor laser element in a casing.

2. Description of the Related Art

In some cases, in an optical element module containing a semiconductor laser element such as an integrated semiconductor laser element or the like (see Japanese Laid-open Patent Publication No. 2011-35060) in a casing, a fluctuation in an ambient temperature causes a warp on a bottom plate of the casing and the warp affects an optical element. To address this, a technology of preventing the warp of the bottom plate from affecting the optical element is disclosed (see Patent Literatures of Japanese Laid-open Patent Publication Nos. 2010-258354, 2008-193003, 2002-131585 and 2009-267386).

SUMMARY OF THE INVENTION

It is an object of the present invention to at least partially solve the problems in the conventional technology.

In accordance with one aspect of the present invention, an optical element module includes: a casing having a bottom plate; a temperature-adjusting unit being mounted on the bottom plate in the casing and having at least a lower layer portion and an upper layer portion positioned above the lower layer portion; a support member mounted on the temperature-adjusting unit in the casing; and a semiconductor laser element being mounted on the support member and outputting a laser light to a front side. The upper layer portion of the temperature-adjusting unit projects at a rear side of the semiconductor laser element relative to the lower layer portion.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
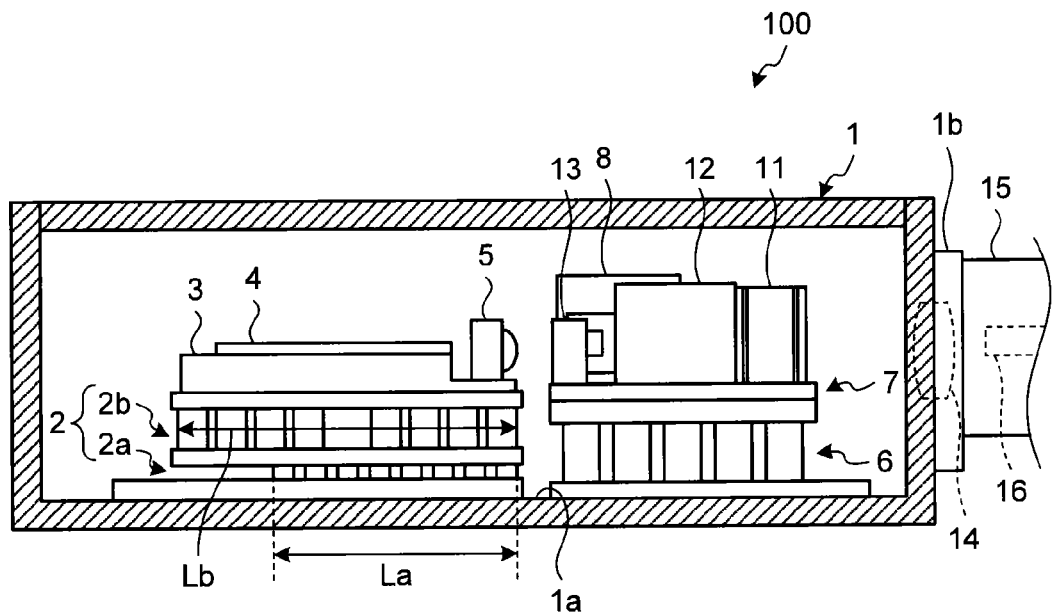
FIG. 1 is a schematic lateral cross-sectional view of an optical element module according to an embodiment 1.

Hereafter, embodiments of an optical element module according to the present invention will be explained in detail with reference to the drawings. These embodiments do not limit the present invention. In all the drawings for embodiments below, identical or equivalent elements are given same reference numerals to omit explanations for convenience. The drawings are schematic depictions, and do not represent the actual relation between a width and a thickness of each layer and ratios of the layers. Different drawings may include portions using different scales and dimensional relations.

The technologies disclosed by the above-described Patent Literatures have difficulty in down-sizing (slimming-down) since a component restraining the warp increases in thickness, or were incapable of dissipation or temperature control satisfactorily in some cases since the semiconductor laser element is of a structure floating from a temperature-adjusting element, thus disadvantageous in terms of power consumption or controlling of characteristics of semiconductor laser elements.

In contrast, the embodiments described below obtains an effect of achieving desirable characteristics for a semiconductor laser element and being adequate for down-sizing and reduction of power consumption.

Figure 2:
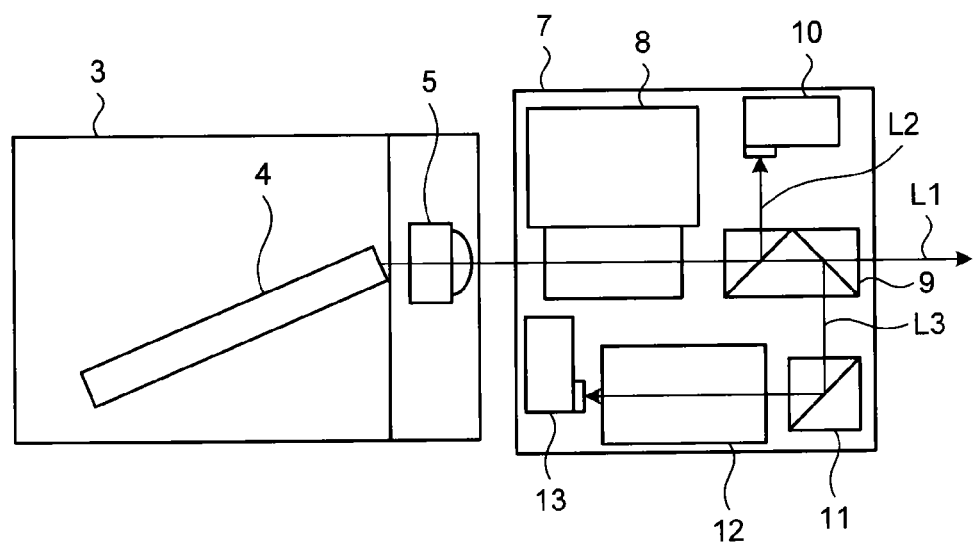
FIG. 2 is a plan view explaining a disposition of each element illustrated in FIG. 1.

FIG. 1 is a schematic lateral cross-sectional view of an optical element module according to an embodiment 1 of the present invention. FIG. 2 is a plan view explaining a disposition of each element illustrated in FIG. 1. As illustrated in FIGS. 1 and 2, an optical element module 100 according to the present embodiment 1 has a configuration that, a temperature-adjusting element 2, a support member 3, an integrated semiconductor laser element 4, a collimation lens 5, a temperature-adjusting element 6, a support member 7, an optical isolator 8, a beam splitter 9, a power-monitoring photo-diode (PD) 10, a reflective prism 11, an etalon filter 12, a wavelength-monitoring PD 13, and a condensing lens 14 are contained in a casing 1.

The casing 1 has a bottom plate 1a, a side wall portion, and an upper lid. Provided at the side wall portion, at a right-hand side of the drawing, is a holder unit 1b in which a condensing lens 14 is contained and to which an optical fiber holder 15, through which the optical fiber 16 is inserted and fixed, is fixed. The casing 1 is sealed so that inside thereof is of an airtight structure. The bottom plate 1a is made of copper-tungsten (CuW) (coefficient of thermal expansion: 8.0 to 9.0×10$^{-6}$/K) of which thermal conductivity is as high as 180 W/m·K to 200 W/m·K. The rest of the casing 1 is made of Kovar (registered trademark) of which coefficient of thermal expansion is low.

The temperature-adjusting element 2 as a temperature-adjusting unit is mounted on the bottom plate 1a in the casing 1. The temperature-adjusting element 2 is a Peltier element having a lower layer portion 2a and an upper layer portion 2b positioned above the lower layer portion 2a. The lower layer portion 2a and the upper layer portion 2b are of a structure that a plurality of upright columnar semiconductor elements (N-type and P-type) are arranged two-dimensionally between substrates. One of the substrate is shared at the upper side of the lower layer portion 2a and the lower side of the upper layer portion 2b. For example, $Al_2O_3$ (coefficient of thermal expansion: 6.0 to $8.0 \times 10^{-6}$/K) or aluminum nitride (AlN) (coefficient of thermal expansion: 4.0 to $5.0 \times 10^{-6}$/K) can be used for those substrates. Intervals among the upper ends or among the lower ends of the N-type semiconductor elements and the P-type semiconductor elements are connected by a metal electrode; thereby the N-type semiconductor elements and the P-type semiconductor elements are in a series connection alternately. For example, BiTe (coefficient of thermal expansion: 16.0 to $18.0 \times 10^{-6}$/K) can be used for the semiconductor element. The temperature-adjusting element 2 is, when a driving current is supplied thereto, capable of cooling the integrated semiconductor laser element 4, and thereby adjusting its temperature.

Herein, a front side indicates a side of outputting a laser light from the integrated semiconductor laser element 4, and a rear side indicates its opposite side, and the upper layer portion 2b of the temperature-adjusting element 2 projects to the rear side of the integrated semiconductor laser element 4 relative to the lower layer portion 2a. Lb indicates a total of a length of a superposed portion of the upper layer portion 2b and the lower layer portion 2a of the temperature-adjusting element 2 in the front-to rear direction of the integrated semiconductor laser element 4 and a length of a projecting portion of the upper layer portion 2b. La indicates a length of the lower layer portion 2a in the superposed portion. Herein the lengths La and Lb are defined with reference to columnar semiconductor elements as illustrated in FIG. 1.

The support member 3 is mounted on the temperature-adjusting element 2. The support member 3, on which the integrated semiconductor laser element 4 is mounted, is made of AlN (coefficient of thermal expansion: 4.0 to $5.0 \times 10^{-6}$/K) of which thermal conductivity is as high as 150 W/m·K to 170 W/m·K. The integrated semiconductor laser element 4 is mounted above the temperature-adjusting element 2 via the support member 3. The material of the support member 3 is not limited to AlN and may be CuW, silicon carbide (SiC), or diamond or the like. From a viewpoint of dissipation, it is preferable to use a material of which thermal conductivity is equal to or larger than 150 W/m·K.

Figure 3:
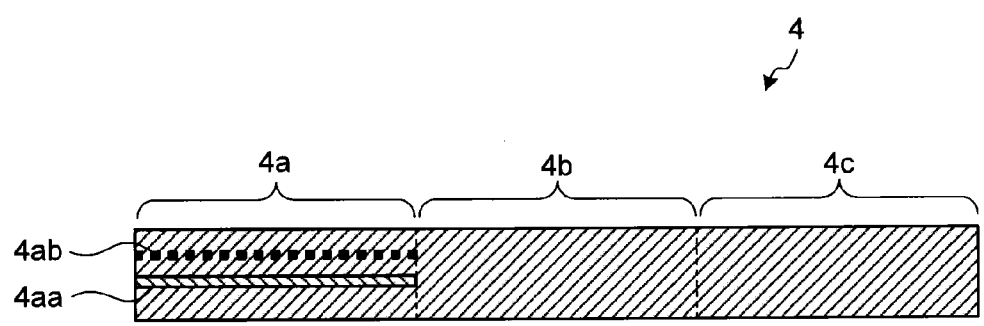
FIG. 3 is a side view explaining a configuration of an integrated semiconductor laser element.

FIG. 3 is a side view explaining a configuration of the integrated semiconductor laser element. As illustrated in FIG. 3, the integrated semiconductor laser element 4 is of a structure similar to that of an integrated semiconductor laser element of a kind disclosed by Japanese Laid-open Patent Publication No. 2011-35060. That is, the integrated semiconductor laser element 4 includes a DFB (Distributed FeedBack) laser portion 4a positioned at the rear side of the integrated semiconductor laser element 4 and provided with a plurality of DFB laser stripes, an optical coupling portion 4b coupling the laser light outputted from the DFB laser portion 4a, and a semiconductor optical amplifier (SOA) portion 4c amplifying the laser light transmitted through the optical coupling portion 4b.

Formed in the DFB laser portion 4a are an active layer 4aa as a light-emission source and a waveguide for the laser light, and a diffraction grating 4ab positioned in the vicinity of the active layer 4aa. The diffraction grating 4ab is of a periodic structure that the refractive index varies periodically along a direction of an optical cavity length of the DFB laser stripe. A laser oscillation wavelength of the DFB laser stripe is determined based on the period of the structure and an element temperature.

Now, returning to FIGS. 1 and 2, the collimation lens 5 is mounted on the support member 3, and is disposed at the front side, i.e., the side at which the laser light of the integrated semiconductor laser element 4 is outputted. The collimation lens 5 converts the laser light L1 outputted by the integrated semiconductor laser element 4 to a collimated light.

The temperature-adjusting element 6 is mounted on the bottom plate 1a in the casing 1 and is disposed at the front side of the integrated semiconductor laser element 4. The temperature-adjusting element 6 is, for example, a Peltier element and is of a structure that a plurality of N-type and P-type semiconductor elements that are upright between substrates are in series connection alternately.

The support member 7 is mounted on the temperature-adjusting element 6. The support member 7 is made of a material, of which thermal conductivity is equal to or larger than 150 W/m·K, such as AlN, CuW, SiC, or diamond or the like. Each of elements such as the optical isolator 8, the beam splitter 9, the power-monitoring PD 10, the reflective prism 11, the etalon filter 12, and the wavelength-monitoring PD 13 is mounted on the support member 7. Each element is subjected to temperature adjustment by the temperature-adjusting element 6.

The optical isolator 8 transmits the laser light L1 inputted from a left-hand side to a right-hand side of the drawing and blocks the transmission of the light from the right-hand side to the left-hand side. Hereby, since a optical feedback is prevented from being inputted to the integrated semiconductor laser element 4, an operation of the integrated semiconductor laser element 4 becomes stable.

The beam splitter 9 transmits therethrough the most of the laser light L1 transmitted through the optical isolator 8 and causes the laser light L1 to be inputted to the condensing lens 14 and reflects a part (laser light L2) of the laser light L1 toward the power-monitoring PD 10. Furthermore, the beam splitter 9 reflects a part (laser light L3) of the laser light L1 toward the reflective prism 11.

The condensing lens 14 causes the laser light L1 transmitted thorough the beam splitter 9 to be condensed to the optical fiber 16 and to be subjected to optical coupling. The optical fiber 16 transmits the laser light L1 to a predetermined device or the like.

Meanwhile, the power-monitoring PD 10 detects a power of the laser light L2 and outputs an electric signal corresponding to the detected power to a controller not illustrated in the drawings.

The etalon filter 12 having periodical transmission characteristics (transmission wavelength characteristics) relative to wavelength transmits therethrough the laser light L3 reflected by the reflective prism 11 selectively, at a transmissivity corresponding to the transmission wavelength characteristics, and inputs the laser light L3 to the wavelength-monitoring PD 13. The wavelength-monitoring PD 13 detects a power of the laser light L3 transmitted through the etalon filter 12 and outputs an electric signal corresponding to the detected power to the controller not illustrated in the drawings. Periods for the transmission wavelength characteristics of the etalon filter 12 are, for example, 50 GHz, 33.3 GHz, 25 GHz, or the like in optical frequencies.

The powers of the laser lights L2 and L3 detected by the power-monitoring PD 10 and the wavelength-monitoring PD 13 are used for wavelength lock control (rendering the wavelength of the laser light L1 to desirable wavelength and power) conducted by the controller.

To be more specific, in the wavelength lock control, the controller controls a driving current to, and a temperature of, the integrated semiconductor laser element 4 so that a ratio of the power of the laser light L2 detected by the power-monitoring PD 10 and the power of the laser light L3 detected by the wavelength-monitoring PD 13 after being transmitted through the etalon filter 12 becomes a ratio in which the laser light L1 is of a desirable power and a desirable wavelength of. Hereby the laser light L1 can be controlled to the desirable power and the desirable wavelength (lock wavelength).

Herein, in some cases, a warp of the integrated semiconductor laser element 4 occurs if a fluctuation of the ambient temperature of the optical element module 100 causes a warp of the bottom plate 1a of the casing 1. In this case, a bending of the diffraction grating 4ab of the DFB laser portion 4a changes its period, and thus causes the laser oscillation wavelength of the DFB laser portion 4a to change. If the laser oscillation wavelength in this state changes greater than the period of the etalon filter 12, there is a possibility that the laser oscillation wavelength is locked at a wavelength which is other than a desirable wavelength in the wavelength lock control. For example, even in an attempt to lock a wavelength of a predetermined transmission peak of the etalon filter 12, and if the laser oscillation wavelength changes to a wavelength of a transmission peak adjacent to the predetermined transmission peak, there is a possibility that a laser oscillation wavelength is locked at the wavelength of the adjacent transmission peak inevitably.

By contrast, since the optical element module 100 according to the present embodiment 1 has a structure that the upper layer portion 2b of the temperature-adjusting element 2 projects relative to the lower layer portion 2a and at the rear side of the integrated semiconductor laser element 4 and a space is formed below the projecting portion of the upper layer portion 2b, transmission of a stress caused by the warp of the bottom plate 1a to the integrated semiconductor laser element 4 is alleviated. As a result, the DFB laser portion 4a is prevented or restrained from changing the laser oscillation wavelength, thus desirable characteristics of the integrated semiconductor laser element 4 are achieved.

In particular, in a case where, for example, a cavity length is equal to or larger than 3 mm in length for high power output of equal to or larger than 20 mW or narrowing of laser linewidth of equal to or smaller than 1 MHz, or where the temperature-adjusting element 2 is elongated in shape in an aspect ratio of equal to or larger than 1.3:1 for down-sizing the optical element module 100, the warp of the bottom plate 1a is more likely to be transmitted to the DFB laser portion 4a. Therefore, it is more effective to alleviate the transmission by the configuration of the present embodiment 1.

Furthermore, since the optical element module 100 achieves the structure of restraining the warp with the structure of the temperature-adjusting element 2, it is suitable for down-sizing (slimming down), and since the optical element module 100 is of the structure that the integrated semiconductor laser element 4 does not float from the temperature-adjusting element 2, it is advantageous in terms of dissipation and temperature control, and suitable in reducing power consumption and controlling the characteristics of the integrated semiconductor laser element 4.

As described above, the optical element module 100 according to the present embodiment 1 is suitable for down-sizing and reducing power consumption while achieving desirable characteristics for the integrated semiconductor laser element 4.

Figure 4:
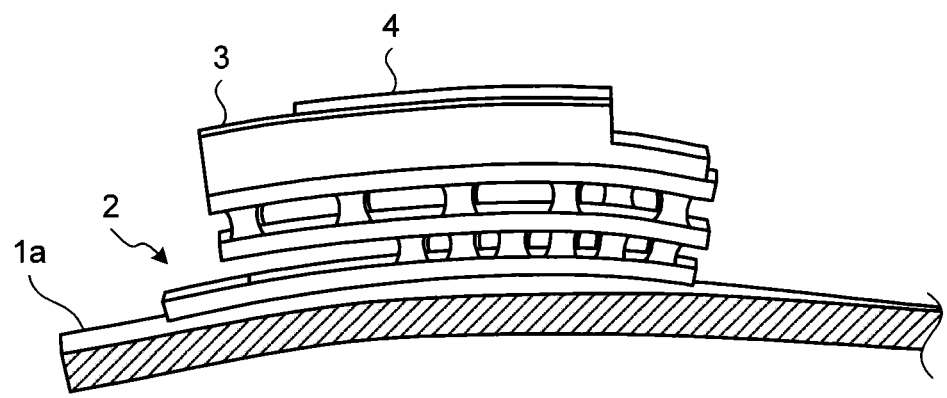
FIG. 4 is a schematic view of a calculation model according to an example.
Figure 5:
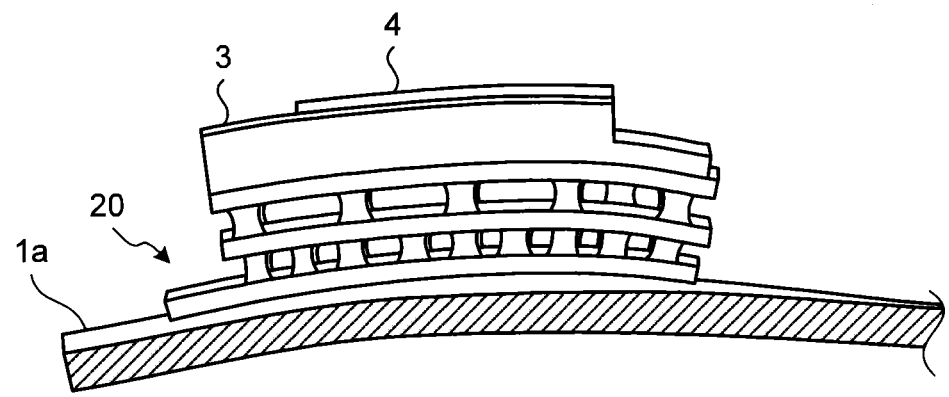
FIG. 5 is a schematic view of a calculation model according to a comparative example.

Hereafter, a calculation by simulation as an example of the present invention, being illustrated in FIG. 4 and similar to the above-described embodiment 1, was conducted by using a calculation model configured by the bottom plate 1a, the temperature-adjusting element 2, the support member 3, and the integrated semiconductor laser element 4, and a warp occurred therein. Similarly, a calculation by simulation was conducted by using a calculation model configured by the bottom plate 1a, a temperature-adjusting element 20, the support member 3, and the integrated semiconductor laser element 4 as illustrated in FIG. 5, and a warp occurred therein. Although the temperature-adjusting element 20 has the lower layer portion and the upper layer portion similarly to the temperature-adjusting element 2, the temperature-adjusting element 20 is of a structure that the upper layer portion does not project relative to the lower layer portion.

The bottom plate 1a is made of CuW (coefficient of thermal expansion: $9.0 \times 10^{-6}$/K) of which thickness is 0.5 mm. The temperature-adjusting element 2 is a Peltier element using BiTe (coefficient of thermal expansion: $17.0 \times 10^{-6}$/K) as a semiconductor element. The temperature-adjusting element 2 is 1.7 mm in overall height. The length Lb is 6 mm and the length La is 3.5 mm. The projecting portion is 2.5 mm in length. The substrate at the lower side of the lower layer portion 2a is made of AlN (coefficient of thermal expansion: $5.0 \times 10^{-6}$/K), and both the two substrates at the upper side thereof are made of $Al_2O_3$ (coefficient of thermal expansion: $8.0 \times 10^{-6}$/K). Width of the any of the substrates is 4 mm. The support member 3 is made of AlN of 0.6 mm thickness. The integrated semiconductor laser element 4 is 3.5 mm in length.

Figure 6:
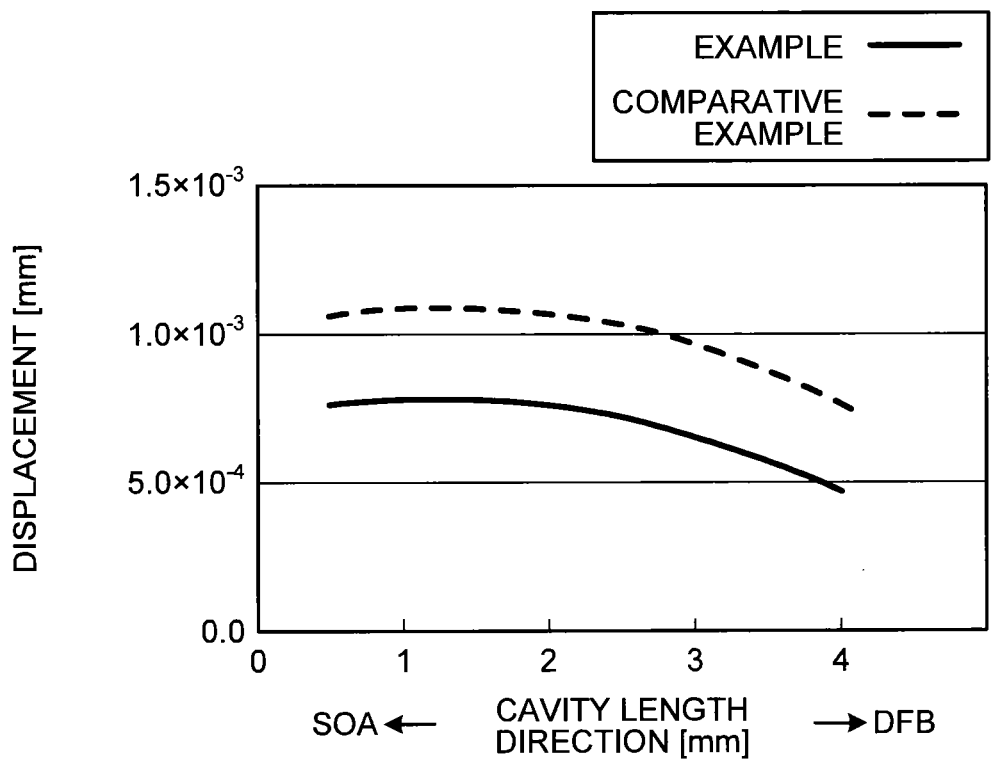
FIG. 6 is a view illustrating displacements, of the example and the comparative example, in cavity length directions.

FIG. 6 is a view illustrating displacements, of the example and the comparative example, in cavity length directions. FIG. 6 shows a displacement in a state of $-5°$ C. of casing temperature with reference to a position in a state where the casing temperature is $35°$ C. The horizontal axis as a cavity length direction indicates a position in the cavity length direction of the DFB laser stripe. A smaller value in the horizontal axis indicates the SOA portion side and a larger value indicates the DFB laser portion side.

As illustrated in FIG. 6, the displacement was smaller in the example than in the comparative example. When the curves of the example and the comparative example were approximated respectively with a quadratic function, a second order coefficient was $-5.06 \times 10^{-5}$ in the comparison example. As compared with it, a second order coefficient in the example was $-3.86 \times 10^{-5}$, which is smaller as an absolute value. Hereby it was confirmed that the warp is smaller in the example than in the comparative example.

Figure 7:
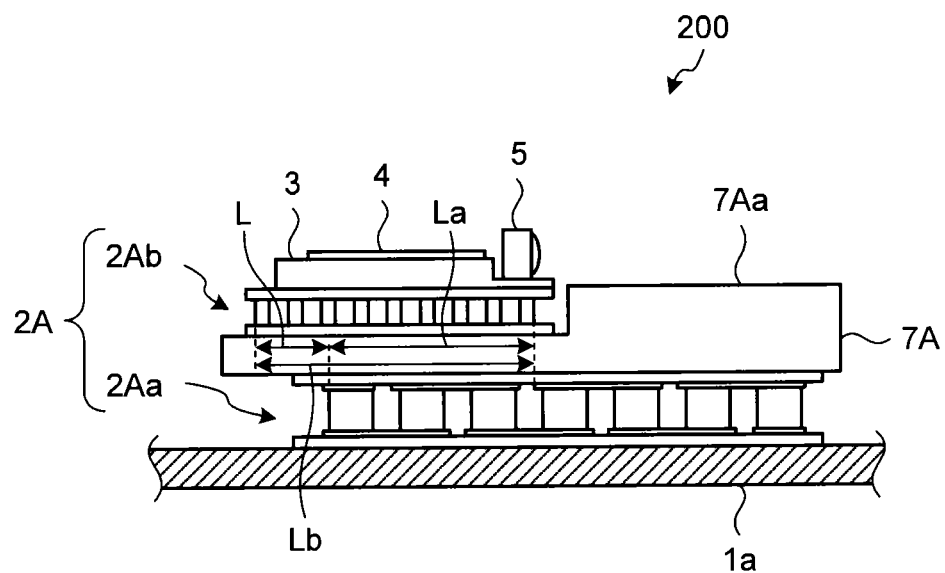
FIG. 7 is a schematic lateral view of an essential part of an optical element module according to an embodiment 2.

FIG. 7 is a schematic lateral view of an essential part of an optical element module according to an embodiment 2 of the present invention. As illustrated in FIG. 7, in the optical element module 200 according to the present embodiment 2, a temperature-adjusting unit 2A is mounted on the bottom plate 1a of the casing 1.

The temperature-adjusting unit 2A has a temperature-adjusting element 2Aa as a lower layer portion, a support member 7A mounted on the temperature-adjusting element 2Aa, and a temperature-adjusting element 2Ab as an upper layer portion mounted on the support member 7A. Mounted on the temperature-adjusting element 2Ab is the support member 3 on which the integrated semiconductor laser element 4 and the collimation lens 5 are mounted. Mounted on an upper surface 7Aa of the support member 7A are the optical isolator 8, the beam splitter 9, the power-monitoring PD 10, the reflective prism 11, the etalon filter 12, and the wavelength-monitoring PD 13 illustrated in FIGS. 1 and 2.

Each of the temperature-adjusting elements 2Aa and 2Ab is a Peltier element and has a structure that a plurality of upright semiconductor elements (N type and P type) are arranged two-dimensionally between substrates. Intervals among the upper ends or among the lower ends of the N-type semiconductor elements and the P-type semiconductor elements are connected by a metal electrode, thereby the N-type semiconductor elements and the P-type semiconductor elements are in a series connection alternately.

Since the optical element module 200 according to the present embodiment 2 has a structure that the temperature-adjusting element 2Ab as the upper layer portion 2b of the temperature-adjusting element 2A projects relative to the temperature-adjusting element 2Aa as the lower layer portion and at the rear side of the integrated semiconductor laser element 4 and a space is formed below the projecting portion of the temperature-adjusting element 2Ab, transmission of a stress, caused by the warp of the bottom plate 1a, to the integrated semiconductor laser element 4 is eased. As a result, the DFB laser portion 4a is restrained or prevented from a change in the laser oscillation wavelength, thus desirable characteristics for the integrated semiconductor laser element 4 are achieved.

Furthermore, since the optical element module 200 achieves the structure of restraining the warp with the structure of the temperature-adjusting unit 2A, the optical element module 200 is suitable for down-sizing (slimming down), and since the optical element module 200 is of the structure that the integrated semiconductor laser element 4 does not float from the temperature-adjusting unit 2A, the optical element module 200 is advantageous in terms of dissipation and temperature control, thus suitable for reducing power consumption and controlling the characteristics of the integrated semiconductor laser element 4.

Herein a change in the laser oscillation wavelength of the DFB laser portion 4a, caused by a change in the temperature of the integrated semiconductor laser element 4 was studied in a case where, in the structure of the optical element module 200 according to the embodiment 2, the length L of the projecting portion of the temperature-adjusting element 2Ab as the upper layer portion relative to the temperature-adjusting element 2Aa as the lower layer portion was set at different values. Herein the length L was defined with reference to the columnar semiconductor element as illustrated in FIG. 7.

The bottom plate 1a is made of 0.5 mm thickness of CuW. The temperature-adjusting elements 2Aa and 2Ab are Peltier elements using BiTe as the semiconductor elements. The temperature-adjusting element 2Ab is 6.5 mm in length. The temperature-adjusting elements 2Aa and 2Ab are 1.6 mm and 0.9 mm respectively in overall height. The substrate at the lower side of the temperature-adjusting element 2Aa is made of $Al_2O_3$. Any one of the other substrates of the temperature-adjusting elements 2Aa and 2Ab is made of AlN. The support member 7A is made of AlN, and a portion on which the temperature-adjusting element 2Ab is mounted is 0.7 mm in thickness. The support member 3 is made of AlN in a thickness of 0.6 mm. A distance between a rear end of the integrated semiconductor laser element 4 and a rear end of the temperature-adjusting element 2Ab is 2.0 mm.

Figure 8:
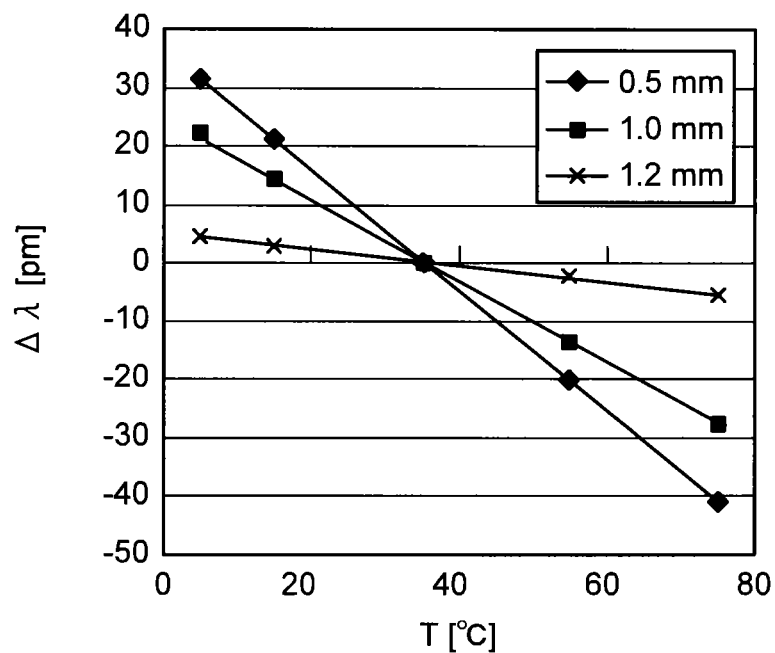
FIG. 8 is a view illustrating a relationship between temperature and laser oscillation wavelength relative to different projection lengths.

FIG. 8 is a view illustrating a relationship between temperature and laser oscillation wavelength relative to different projection lengths. A vertical axis indicates fluctuation amount $\Delta\lambda$ of the laser oscillation wavelength. $\Delta\lambda=0$ indicates that the temperature T is 35° C. As illustrated in FIG. 8, it was confirmed that $\Delta\lambda$ decreased along with an increase in the projection length from 0.5 mm to 1.2 mm. This indicates that the longer the projection length, the greater an effect of alleviating the warp. For example, in order to limit the fluctuation amount $\Delta\lambda$ of the laser oscillation wavelength within a typical allowable range of ±20 pm (picometer), the projection length may be 1.2 mm. As described above, the projection length can be set corresponding to the allowable range of the fluctuation amount of the laser oscillation wavelength.

Figure 9:
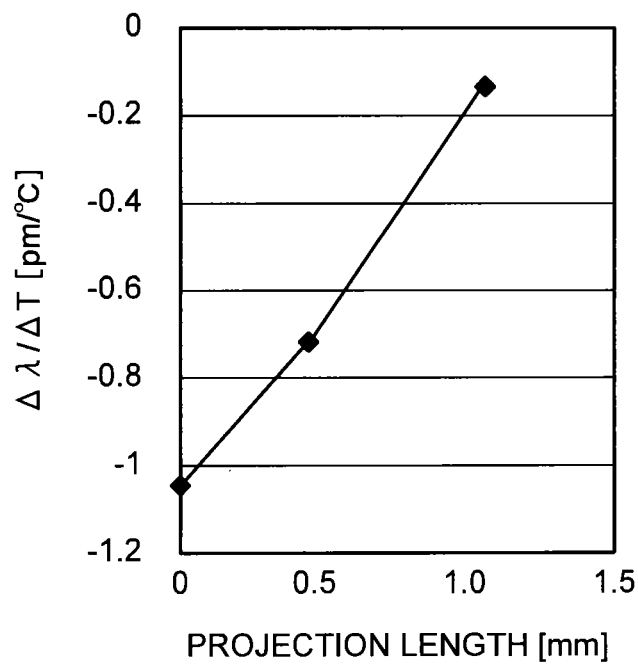
FIG. 9 is a view illustrating a relationship between projection length and temperature dependence of the laser oscillation wavelength.

FIG. 9 is a view illustrating a relationship between projection length and temperature dependence $\Delta\lambda/\Delta T$ of the laser oscillation wavelength. $\Delta\lambda/\Delta T$ in the vertical axis is equivalent to an inclination of each line in FIG. 8. As illustrated in FIG. 9, the temperature dependence of the laser oscillation wavelength decreases along with an increase in the projection length from 0 mm to 1.2 mm. For example, in order to limit an absolute value of the temperature dependence $\Delta\lambda/\Delta T$ of the laser oscillation wavelength within a typical allowable range of equal to or smaller than 0.4 pm/° C., the projection length may be equal to or larger than 0.7 mm. As described above, the projection length may be set corresponding to the allowable range of the temperature dependence $\Delta\lambda/\Delta T$ of the laser oscillation wavelength.

A study conducted by the inventors of the present invention confirmed that it is preferable that $0.5<y/x<0.85$ holds true where x indicates a total (length Lb) of a length of a superposed portion in which the upper layer portion and the lower layer portion of the temperature-adjusting unit are superposed in the front-to-rear direction of the semiconductor laser element and a length of the projecting portion of the upper layer portion, and y indicates a length (length La) of the lower layer portion in the superposed portion. For example, in a case where the projection length is 0.5 mm in FIGS. 8 and 9, y/x is obtained as $(6.5-0.5)/(6.5)$=approx. 0.92. In a case where the projection length is preferable, i.e., 1.2 mm, y/x is obtained as $(6.5-1.2)/(6.5)$=approx. 0.82.

That is, if the length of the projecting portion is equal to or larger than about 15% relative to the length of the superposed portion such as y/x<0.85, an effect of alleviating the transmission of the warp is achieved. As described above, since the distance between the rear end of the integrated semiconductor laser element 4 and the rear end of the temperature-adjusting element 2Ab is 2.0 mm, the DFB laser portion 4a of the integrated semiconductor laser element 4 is not disposed immediately above the projecting portion even though the projection length is preferable, i.e., 1.2 mm. As described above, an experiment conducted by the inventors of the present invention confirmed that the transmission of the warp is alleviated only if a portion which should not be affected by the warp such as the DFB laser portion 4a of the integrated semiconductor laser element 4 is disposed in the vicinity of the projecting portion, even though the portion is not disposed immediately above the projecting portion. This can be achieved by, for example, disposing the DFB laser portion 4a so that the front side of the DFB laser portion 4a (laser emission side) is positioned at the rear side (opposite side to a laser emission side) by equal to or larger than 0.5 mm relative to the front side of the superposed portion in which the upper layer portion and the lower layer portion of the temperature-adjusting unit are superposed in the front-to-rear direction of the semiconductor laser element.

In order to further reduce an influence of the warp, it is preferable that the front end portion of the DFB laser portion 4a is disposed immediately above the projecting portion.

In order to obtain a strength capable of enduring a load for an implementation of components on the temperature-adjusting unit or a load for wire-bonding electronic components (for example, a popular wire-bonder's load amount is 50 g), $0.5<y/x$ is preferable. Hereby the lower layer portion can be obtained which ensures a mechanical strength and which is not too short in length.

It is preferable that $0.5<y/x<0.85$ holds true if a case is applicable where, the upper layer portion and the lower layer portion of the semiconductor element of the temperature-adjusting element are equal to or larger than 0.5 mm and equal to or smaller than 2.0 mm in height, a total thickness of the substrate at the upper side of the lower layer portion and the substrate at the lower side of the upper layer portion (including a thickness of a support member if is disposed therebetween) is equal to or larger than 1.0 mm and equal to or smaller than 2.0 mm, depths of the temperature-adjusting element and the bottom plate are equal to or larger than 5 mm and equal to or smaller than 8.0 mm, and the thickness of the bottom plate of the casing is equal to or larger than 0.3 mm and equal to or smaller than 1.0 mm.

The semiconductor laser element of the above-described embodiments is an integrated semiconductor laser element, but may be, for example, a DFB laser element. The temperature-adjusting unit is not limited to be of the double-layered structure including the upper layer portion and the lower layer portion, but may be of a triple-or-more-layered structure.

The present invention is not limited by the above-described embodiments. The present invention includes a configuration of appropriately combining each of the above-described elements. Further effects or modifications can be derived by those skilled in the art easily. Therefore, further wide aspects of the present invention are not limited to the above-described embodiment, and various modifications are possible.

As described above, the optical element module according to the present invention is suitable for use in a light source or the like for optical communication.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical element module comprising:
a casing having a bottom plate;
a temperature-adjusting unit being mounted on the bottom plate in the casing and having at least a lower layer portion and an upper layer portion positioned above the lower layer portion;
a support member mounted on the temperature-adjusting unit in the casing; and
a semiconductor laser element being mounted on the support member and outputting a laser light to a front side, wherein
the upper layer portion of the temperature-adjusting unit projects at a rear side of the semiconductor laser element relative to the lower layer portion.

2. The optical element module according to claim 1, wherein the temperature-adjusting unit is configured with a Peltier element having a structure that a plurality of semiconductor elements are disposed upright between substrates.

3. The optical element module according to claim 1, wherein the semiconductor laser element has a DFB semiconductor laser portion.

4. The optical element module according to claim 3, wherein the DFB semiconductor laser portion is positioned at the rear side of the semiconductor laser element.

5. The optical element module according to claim 3, wherein the DFB semiconductor laser portion is positioned near a projecting portion of the upper layer portion of the temperature-adjusting unit.

6. The optical element module according to claim 3, wherein the DFB semiconductor laser portion is disposed so that an end portion at the front side of the DFB semiconductor laser portion is disposed rearwardly by a distance equal to or larger than 0.5 mm, from an end, at the front side, of a superposed portion of the temperature-adjusting unit, the superposed portion being a portion in which the upper layer portion and the lower layer portion are superposed in a front-to rear direction of the semiconductor laser element.

7. The optical element module according to claim 1, wherein $0.5<y/x<0.85$ holds true, where x indicates a total of a length of a superposed portion of the upper layer portion and the lower layer portion of the temperature-adjusting unit in a front-to rear direction of the semiconductor laser element and a length of a projecting portion of the upper layer portion, and y indicates a length of the lower layer portion in the superposed portion.

8. The optical element module according to claim 4, wherein the DFR semiconductor laser portion is disposed so that an end portion at the front side of the DFB semiconductor laser portion is disposed rearwardly by a distance equal to or larger than 0.5 mm from an end, at the front side, of a superposed portion of the temperature-adjusting unit, the superposed portion being a portion in which the upper layer portion and the lower layer portion are superposed in a front-to rear direction of the semiconductor laser element.

* * * * *